United States Patent
Kim (10) Patent No.: US 7,834,666 B2
(45) Date of Patent: Nov. 16, 2010

(54) VOLTAGE DIVIDER HAVING VARIED OUTPUT LEVELS DEPENDING ON FREQUENCY AND PLL INCLUDING THE SAME

(75) Inventor: Young-Sik Kim, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 33 days.

(21) Appl. No.: 12/274,621

(22) Filed: Nov. 20, 2008

(65) Prior Publication Data

US 2009/0134917 A1    May 28, 2009

(30) Foreign Application Priority Data

Nov. 27, 2007    (KR) .................. 10-2007-0121215

(51) Int. Cl.
*H03D 3/00*    (2006.01)
(52) U.S. Cl. ................ 327/102; 327/147; 327/156; 327/157; 327/158; 327/161
(58) Field of Classification Search ................ 327/102, 327/147, 156, 161
See application file for complete search history.

(56) References Cited

U.S. PATENT DOCUMENTS

| | | | | |
|---|---|---|---|---|
| 5,493,207 A | * | 2/1996 | Beasom | 323/313 |
| 2007/0164810 A1 | | 7/2007 | Chen | |
| 2008/0007311 A1 | * | 1/2008 | Choi | 327/156 |

FOREIGN PATENT DOCUMENTS

| JP | 2004-193901 | 7/2004 |
|---|---|---|
| KR | 2001-0083266 | 9/2001 |

* cited by examiner

Primary Examiner—Lincoln Donovan
Assistant Examiner—John W Poos
(74) Attorney, Agent, or Firm—Volentine & Whitt, P.L.L.C.

(57) ABSTRACT

A voltage divider for dividing an input voltage includes a fixed resistor, a variable resistor, an input node and an output node. The fixed resistor has a fixed resistance value independent of an operating frequency, and includes at least one resistance device. The variable resistor has a variable resistance value that varies corresponding to a variation of the operating frequency. The input node receives the input voltage, and the output node outputs an output voltage, which includes the input voltage divided based on the fixed resistance value and the variable resistance value.

15 Claims, 7 Drawing Sheets

VOLTAGE DIVIDER HAVING VARIED OUTPUT LEVELS DEPENDING ON FREQUENCY AND PLL INCLUDING THE SAME

CROSS-REFERENCE TO RELATED APPLICATIONS

A claim of priority is made to Korean Patent Application No. 10-2007-0121215, filed on Nov. 27, 2007, the subject matter of which is hereby incorporated by reference.

BACKGROUND

1. Technical Field

The present invention relates to a voltage divider and a PLL having a voltage divider, and more particularly, to a voltage divider having a varied output level depending on an operating frequency.

2. Description

A phase lock loop (PLL) circuit is generally regarded as a basic component of conventional electronic systems, used as a frequency feedback circuit to generate an optional frequency synchronizing to a frequency of an externally input signal or as a synchronization circuit to synchronize a clock signal applied to each circuit block.

The PLL circuit has been widely used in communication, multimedia and other applications, such as a frequency synthesizing circuit, a clock recovery circuit of a data processing circuit, an FM demodulator, a MODEM, tone decoder, etc., for example.

Figure 1:
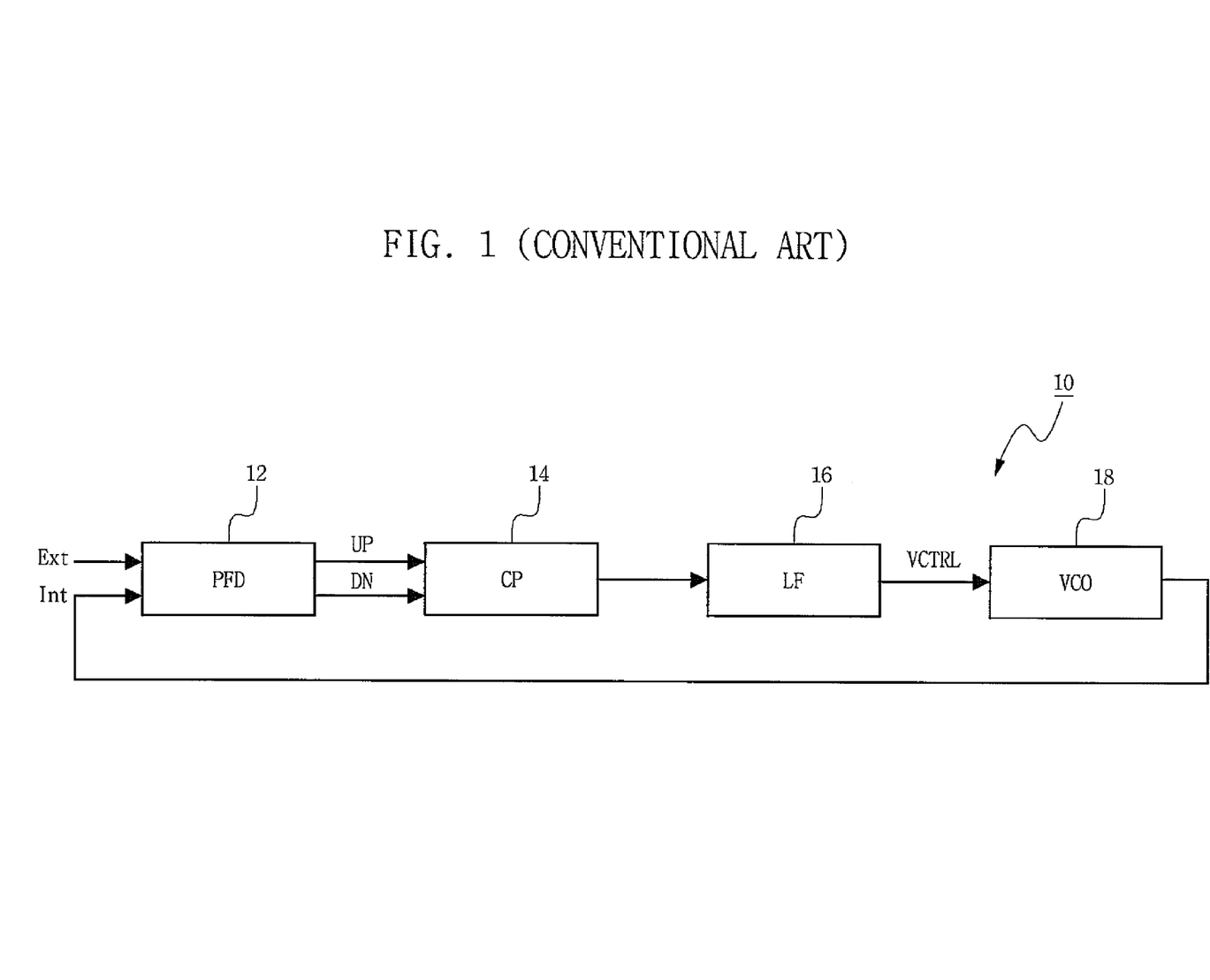
FIG. 1 is a block diagram of a conventional PLL circuit.

FIG. 1 is a block diagram illustrating an example of a conventional PLL circuit. As shown in FIG. 1, a general PLL circuit 10 includes a phase-frequency detector (PFD) 12, charge pump (CP) 14, loop filter (LF) 16 and voltage controlled oscillator (VCO) 18.

The PLL circuit 10 outputs a clock having the same frequency and phase as those of an external reference clock Ext. The PLL circuit 10 may further include a divider DIV (not shown) for dividing an output of the VCO 18 and applying the divided output to the PFD 12. The divider DIV may be further adapted when a frequency higher than the external clock Ext is needed.

An example of the PLL circuit 10 without the divider DIV is described as follows. The PFD 12 compares frequency and phase of the external reference clock Ext and an internal clock Int, which is an output of the VCO 18. The PFD 12 outputs an up signal UP or down signal DN.

The up signal UP is provided so that an oscillation clock of the VCO 18 becomes relatively faster when the internal clock Int is slower than the external reference clock Ext. The down signal DN is provided so that the VCO 18 oscillates relatively more slowly when the internal clock Int is faster than the external reference clock Ext.

The CP 14 controls an output charge amount in response to the up or down signal UP or DN from the PFD 12. As is known, in the CP 14, an output charge amount may increase by the up signal UP and may decrease by the down signal DN. According to this operation of the CP 14, the LP 16 generates a control voltage VCTRL by performing low pass filtering of an output of the CP 14.

The VCO 18 generates the internal clock Int as the oscillation signal having a given frequency based on the control voltage VCTRL generated by the LF 16. The VCO 18 outputs the internal clock Int having a high frequency or a low frequency, according to the control voltage VCTRL.

As a result, the up signal UP is used to increase the control voltage VCTRL of the VCO 18, passing through the CP 14 and the LF 16, and thus the VCO 18 outputs the clock Int at a higher frequency, as compared with the previous output of the VCO 18. In contrast, the down signal DN is used to decrease the control voltage VCTRL of the VCO 18, passing through the CP 14 and the LF 16, so that the VCO 18 oscillates the internal clock Int at a relatively lower frequency.

The conventional PLL circuit 10 described above is a feedback circuit, and therefore requires a relatively large amount of time for performing an initial step through a stabilized step. That is, in operation of the overall system, an operating time of the PLL circuit 10 has a relatively high ratio and thus may significantly affect operation of the overall system.

In the PLL circuit 10, repeated operation of the PFD 12, CP 14, LF 16 and VCO 18 is performed hundreds or thousands of times, and frequency and phase of the reference clock Ext and the internal clock Int become equal. Then, the overall circuit can maintain a stabilized state. The time taken to obtain the stabilized state of the overall PLL circuit 10 is called a lock-in time, which is needed in all kinds of PLL circuits. The lock-in time occupies much of the operating time of the PLL circuit 10, and thus the overall operating time of the PLL circuit 10 can be reduced by lessening the lock-in time.

However, when a PLL circuit is designed to rapidly correspond to a changed level of the reference clock Ext and the internal clock Int to reduce the lock-in time, the PLL circuit in the stabilized state is varied by external noise or fluctuation. Therefore, the overall PLL circuit becomes unstable. That is, it deviates from a basic principle of PLL circuit design, which is that when phase and frequency are first fixed, the PLL circuit must continuously maintain the stable state. It is desirable to maintain stability in the basic form of a general PLL circuit and simultaneously to reduce the lock-in time.

SUMMARY

Accordingly, various embodiments of the invention provide a voltage divider and a PLL circuit having a voltage divider, which maintains stability and shortens lock-in time. In the voltage divider, an output level is varied corresponding to an operating frequency, and an initial voltage can be controlled.

According to an embodiment of the invention, a voltage divider for dividing an input voltage includes a fixed resistor, a variable resistor, an input node and an output node. The fixed resistor has a fixed resistance value independent of an operating frequency, and includes at least one resistance device. The variable resistor has a variable resistance value that varies corresponding to a variation of the operating frequency. The input node receives the input voltage. The output node outputs an output voltage, which includes the input voltage divided based on the fixed resistance value and the variable resistance value.

The variable resistor may include multiple parallel resistance devices that have corresponding different resistance values. The voltage divider may further include a counter for selecting at least one of the resistance devices of the variable resistor by using, as a switching signal, bit signals corresponding to the operating frequency, so as to determine the variable resistance value.

The counter may include one of an up counter or a down counter. Also, the counter may include multiple flip-flops in a cascade connection structure.

The multiple flip-flops may include first and second flip-flops. The first flip-flop may include a first data input that receives an inverted output of the first flip-flop synchronously with a clock signal corresponding to the operating frequency. The second flip-flop may include a clock input and a second data input, the clock input receiving an output of the first flip-flop and the second data input receiving an inverted output of the second flip-flop. Each of flip-flops may include a D flip-flop.

The multiple resistance devices of the variable resistor may be individually coupled to the output node through corresponding switches. Each of the at least one resistance device of the fixed resistor and the plurality of resistance devices of the variable resistor may include an NMOS transistor operating in a saturation region. Each of the switches may include an NMOS transistor operating in a triode or linear region.

According to another embodiment of the invention, a PLL circuit includes a phase and frequency detector, a charge pump, a loop filter, a voltage control oscillator and an initial voltage generator. The phase and frequency detector is configured to compare phase and frequency of a reference signal and an oscillation signal, and to generate a comparison signal corresponding to a phase difference and a frequency difference. The charge pump is configured to control an output charge amount in response to the comparison signal from the phase and frequency detector. The loop filter is configured to filter an output of the charge pump and to generate a control voltage. The voltage control oscillator is configured to initially generate the oscillation signal through an initial voltage, and subsequently to generate the oscillation signal corresponding to the control voltage. The initial voltage generator operates in response to a reset signal of the PLL circuit, and generates the initial voltage having a level that varies corresponding to an operating frequency, and provides the initial voltage to the voltage control oscillator.

The initial voltage generator may include a pulse generator configured to generate a pulse, which includes an enable section, in response to the reset signal of the PLL circuit; and a voltage divider configured to operate at the enable section of the pulse and to generate the initial voltage having the level that varies corresponding to the operating frequency.

The voltage divider may include a fixed resistor, a variable resistor, an input node and an output node. The fixed resistor has a predetermined fixed resistance value regardless of the operating frequency, and includes at least one resistance device. The variable resistor has a variable resistance value varying corresponding to a variation of the operating frequency. The input node is configured to receive the input voltage. The output node is configured to output as an output voltage the input voltage divided based on the fixed resistance value and the variable resistance value.

The variable resistor may include multiple resistance devices connected in parallel and having corresponding different resistance values. The voltage divider may further include a counting unit configured to select at least one of the resistance devices of the variable resistor by using multiple bit signals corresponding to the operating frequency as a switching signal, so as to determine the variable resistance value.

The counting unit may be one of an up counter or a down counter. The counting unit may also include multiple flip-flops in a cascade coupling structure.

The multiple flip-flops may include at least first and second flip-flops. The first flip-flop may include a first data input for receiving an inverted output of the first flip-flop, synchronously to a clock signal corresponding to the operating frequency. The second flip-flop may include a clock input for receiving an output of the first flip-flop and a second data input for receive an inverted output of the second flip-flop. Each of flip-flops may be a D flip-flop.

The resistance devices of the variable resistor may be individually coupled to the output node through corresponding switches. Each of the resistance device of the fixed resistor and the resistance devices of the variable resistor may include an NMOS transistor operating in a saturation region. Each of the switches may include an NMOS transistor operating in a triode or linear region.

According to another embodiment of the invention, a voltage divider includes a variable resistor having a resistance value that varies corresponding to a variation of an operating frequency; and a fixed resistor having a fixed resistance value regardless of the variation of the operating frequency. The voltage divider generates an output voltage varied corresponding to the operating frequency.

According to the various embodiments, stability may be maintained, while a lock-in time of the PLL circuit may be reduced. Additionally, a voltage divider varying an output level corresponding to an operating frequency may be realized. Furthermore, an initial voltage of the voltage divider may be controlled.

BRIEF DESCRIPTION OF THE DRAWINGS

The embodiments of the present invention will be described with reference to the attached drawings, which are given by way of illustration, in which.

DETAILED DESCRIPTION OF THE EMBODIMENTS

The present invention will now be described more fully with reference to FIGS. 2 to 7, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art, and will not be interpreted in an idealized or overly formal sense unless expressly so defined herein. Exemplary embodiments of the present invention are more fully described below with reference to FIGS. 2 to 7.

Figure 2:
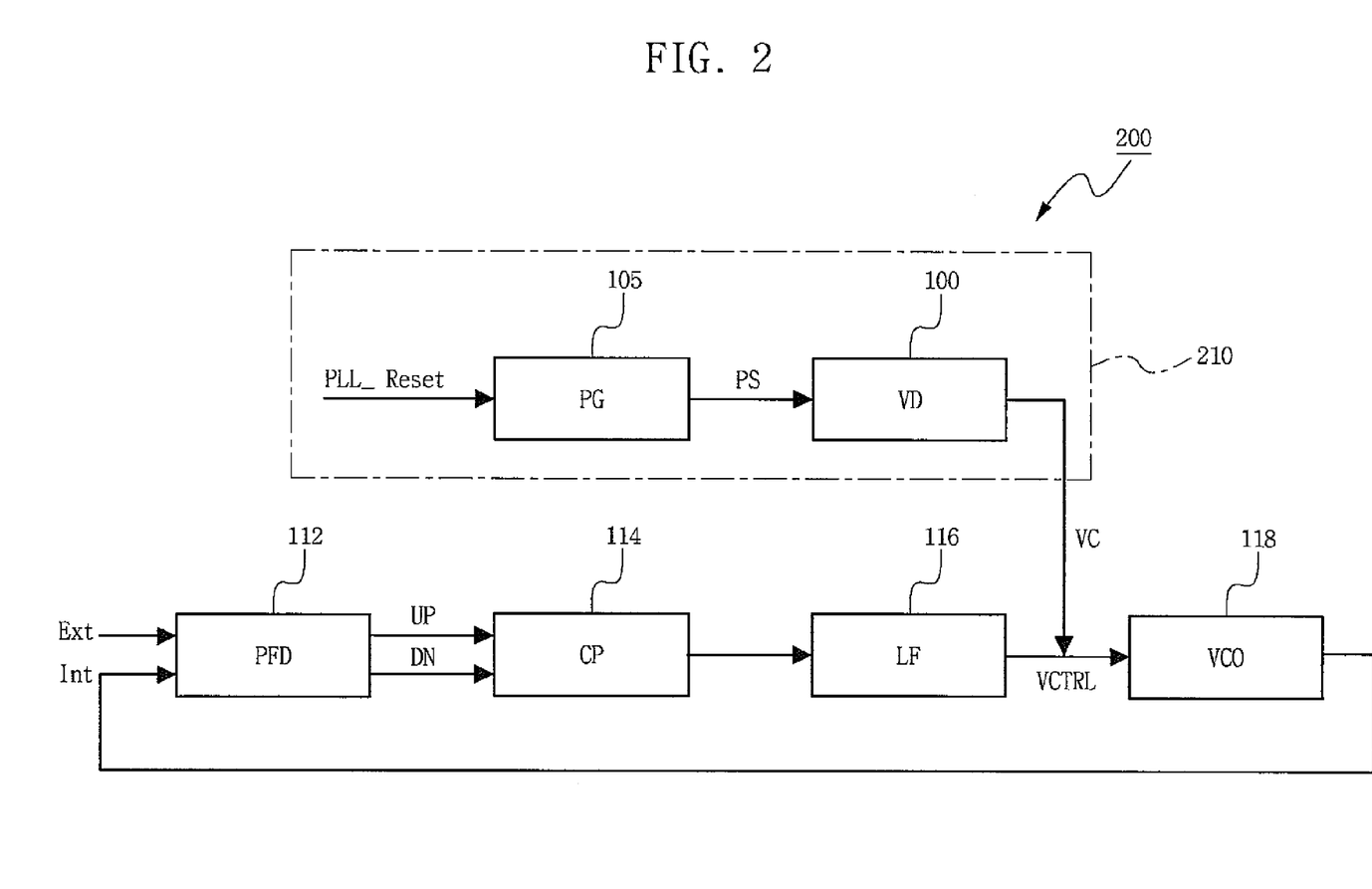
FIG. 2 is a block diagram of a PLL circuit, according to an illustrative embodiment of the invention.

FIG. 2 is a block diagram of a PLL circuit, according to an illustrative embodiment of the invention.

As shown in FIG. 2, PLL circuit 200, according to an illustrative embodiment of the invention, includes phase and frequency detector PFD 112, charge pump CP 114, loop filter LF 116, voltage control oscillator VCO 118 and initial voltage generator 210.

The PLL circuit 200 may further include a divider DIV (not shown) for dividing a frequency of an output of the VCO 118 and applying the divided output to the PFD 12. The DIV may be included in the PLL circuit 200 when a frequency higher than an external reference clock Ext is required.

The PFD 112 compares frequency and phase of internal clock Int, which is output from the VCO 118, and the external reference clock Ext, and outputs an up signal UP or down signal DN as a comparison signal based on the result of the comparison. The up signal UP is provided so that an oscillation clock of the VCO 118 becomes relatively faster when the internal clock Int is slower than the external reference clock Ext. The down signal DN is provided so that an oscillation clock of the VCO 118 becomes relatively slower when the internal clock Int is faster than the external reference clock Ext.

The CP 114 controls an output charge amount in response to the comparison signal UP or DN output from the PFD 112. In the CP 114, the output charge amount may increase by the up signal UP and may decrease by the down signal DN. The LF 116 generates a control voltage VCTRL by performing a low pass filtering, for example, on the output of the CP 114.

The VCO 118 initially generates the internal clock Int as the oscillation signal through an initial voltage VC generated by the initial voltage generator 210, and subsequently generates the internal clock Int as an oscillation signal corresponding to the control voltage VCTRL generated by the LF 116. The operation of generating the internal clock Int in response to the control voltage VCTRL continues for a lock-in time of the PLL circuit 200.

As a result, the up signal UP is used to increase the control voltage VCTRL of the VCO 118, passing through the CP 114 and the LF 116. In response to the increased control voltage VCTRL, the VCO 118 oscillates the internal clock Int at a frequency higher than a previous internal clock Int. In comparison, the down signal DN is used to decrease the control voltage VCTRL of the VCO 118, passing through the CP 114 and the LF 116. In response to the decreased control voltage VCTRL, the VCO 118 oscillates the internal clock Int at a relatively lower frequency.

The initial voltage generator 210 is provided to reduce the lock-in time. For example, the initial voltage generator 210 provides an initial voltage VC having a specific level to the VCO 118.

As discussed above, a PLL generally has a structure in which an input voltage is input to the VCO, and systematically changed from a ground level 0V to a desired level through a feedback loop. The operating time needed to go from ground level to the desired level, i.e., the lock-in time, is relatively long, causing excessive time and overhead consumption.

However, when in generating internal clock Int having the same phase and frequency as the external reference clock Ext, a level of the input voltage of the VCO 118 is previously known and the level of the input voltage is used as an initial voltage of the VCO 118, the lock-in time can be reduced.

Therefore, the initial voltage generator 210 supplying an initial voltage having a specific level to the VCO 118 is included.

The initial voltage generator 210 may include, for example, a pulse generator PG 105 and a voltage divider VD 100. The PG 105 generates a pulse PS, which includes a predetermined enable section, in response to a reset signal PLL_Reset of the PLL circuit 200. The PG 105 may be designed so that the enable section of the pulse PS includes the time in which an initial voltage can be generated in the voltage divider VD 100, that is, the time interval for reaching a desired initial voltage level. The VD 100 operates only at the enable section of the pulse PS, and generates the initial voltage VC through a voltage division corresponding to a specific input voltage.

Figure 3:
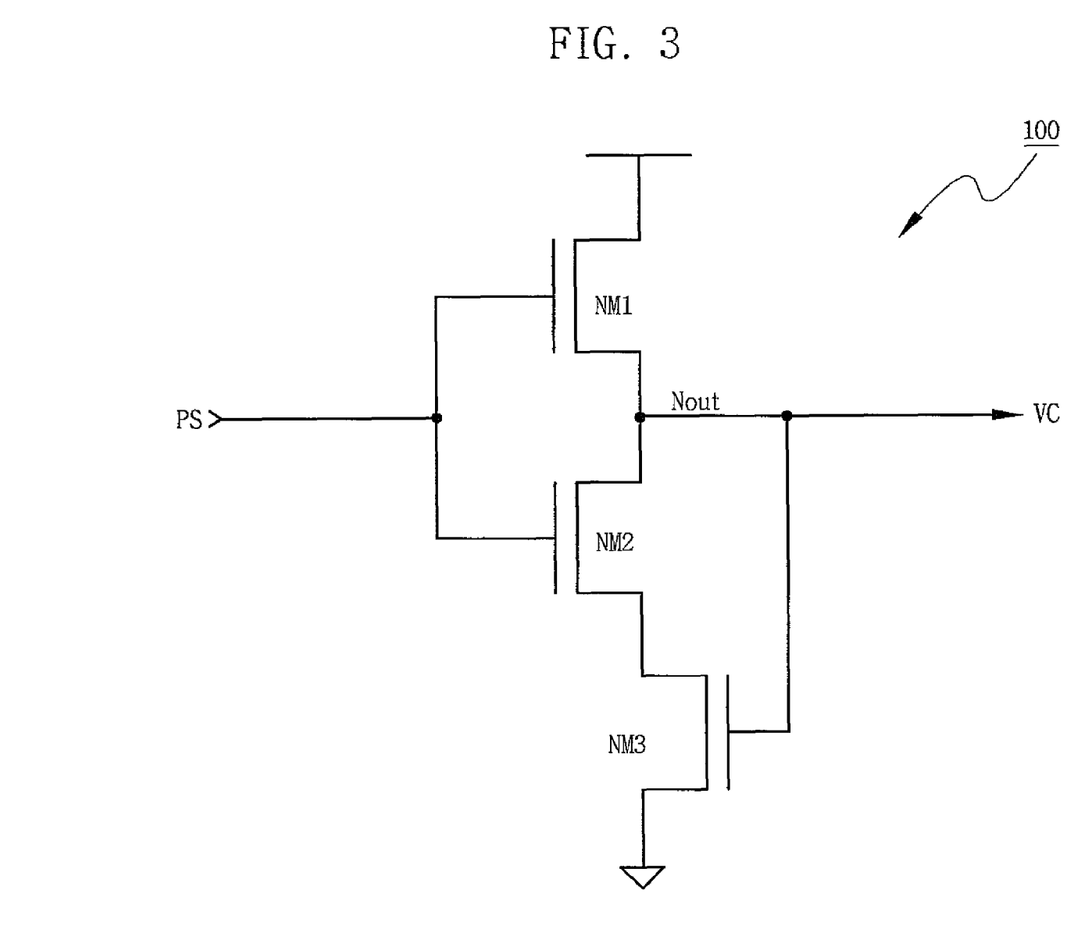
FIG. 3 is a circuit diagram of a voltage divider shown in FIG. 2, according to an illustrative embodiment of the invention.

An example of the VD 100 is shown in FIG. 3, which is a circuit diagram of the VD 100 shown in FIG. 2, according to an illustrative embodiment of the invention.

As illustrated in FIG. 3, the voltage divider 100 includes three NMOS transistors NM1, NM2 and NM3. The three NMOS transistors NM1, NM2 and NM3 are serially coupled between a power voltage terminal and a ground terminal. The NMOS transistor NM1 is coupled between the power voltage terminal and an output node Nout, and the NMOS transistors NM2 and NM3 are serially coupled between the output node Nout and the ground terminal. The pulse signal PS is input to gates of the NMOS transistor NM1 and the NMOS transistor NM2. The output node Nout is coupled to a gate of the NMOS transistor NM3.

An illustrative operation of the voltage divider 100 is described as follows. When the pulse PS generated in the PG 105 becomes a high level, the NMOS transistors NM1, NM2 and NM3 are turned on. In the NMOS transistor NM1, gate and drain voltages have the same voltage level and can operate in a saturation area. In the NMOS transistor NM3, gate and drain voltages are almost the same as each other, and can operate in a saturation area. The NMOS transistor NM2 can operate in a triode (or linear) area. The NMOS transistor NM2 is turned off when the pulse PS becomes a low level, and prevents current of the output node Nout from escaping through the NMOS transistor NM3.

In the voltage divider 100, the power voltage VDD divides in proportion to the resistance values of the NMOS transistors NM1 and NM3. The resistance value of an NMOS transistor is a function of its W/L value in which W represents the width of the channel of the NMOS transistor and L represents the length of the channel of the NMOS transistor. If it is used that the amount of current passing through the NMOS transistor NM1 is equal to the amount of current passing through the NMOS transistor NM3, the output voltage of the voltage divider 100, i.e., the initial voltage is obtained as the following equation:

$$VC = ((W1/L1)^{1/2} * (VDD - Vth) + (W3/L3)^{1/2} * Vth) / ((W3/L3)^{1/2} + (W1/L1)^{1/2})$$

Here, Vth indicates the threshold voltage of the NMOS transistors, W1 and L1 represent the width and length of the channel of the NMOS transistor NM1, and W3 and L3 represent the width and length of the channel of the NMOS transistor NM3.

Here, as the value of "W3/L3" increases while the value of "W1/L1" remains fixed, the level of the initial voltage VC decreases. Likewise, as the value of "W3/L3" decreases while the value of "W1/L1" remains fixed, the level of the initial voltage VC increases. Further, for example, when "W1/L1" and "W3/L3" have the same value, the initial voltage VC becomes "VDD*½".

Figure 4:
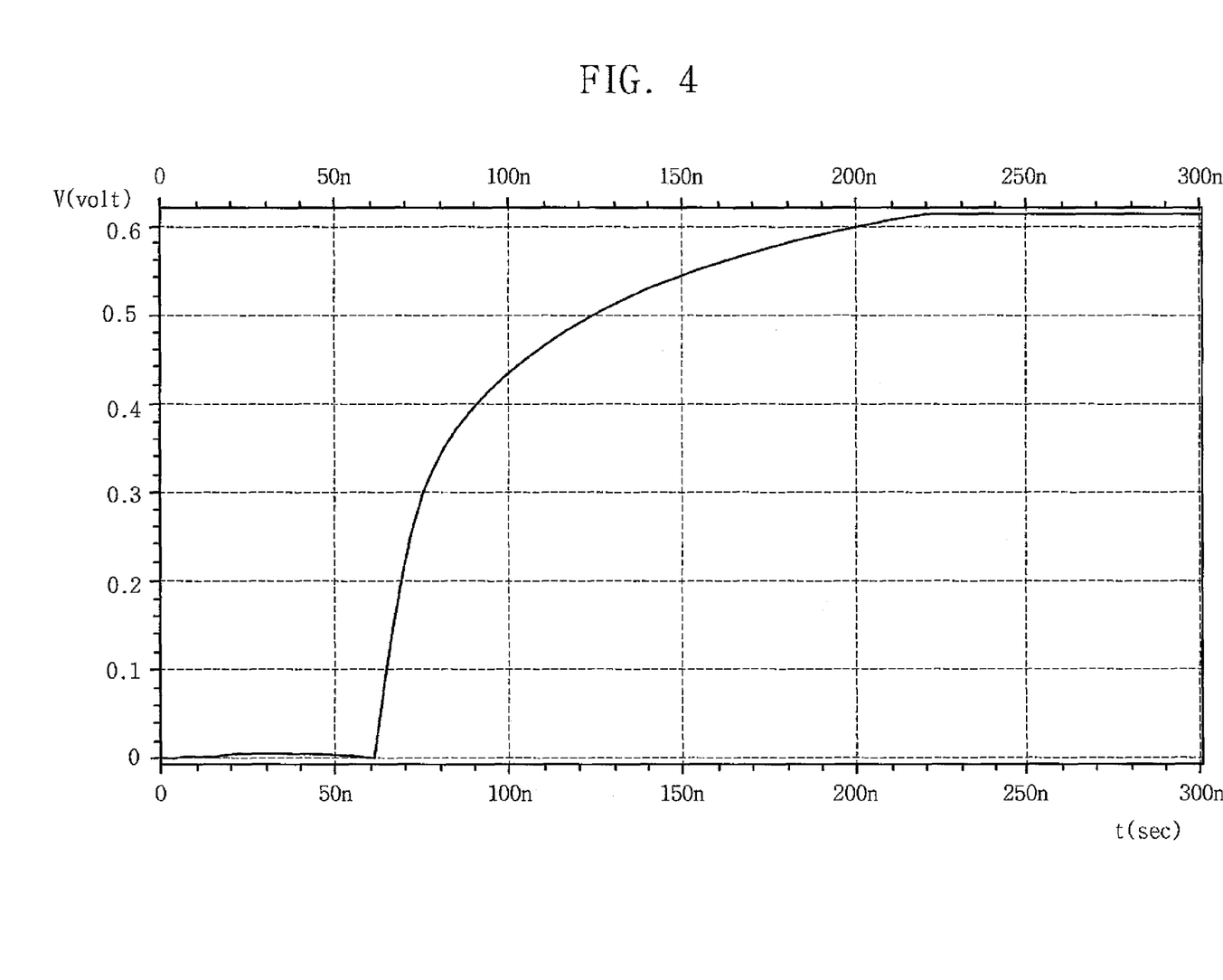
FIG. 4 is a graph illustrating an example of an initial voltage change of FIG. 3, according to an illustrative embodiment of the invention.

FIG. 4 is a graph illustrating an example of the initial voltage VC of the voltage divider 100 in FIG. 3, according to an illustrative embodiment of the invention.

As shown in FIG. 4, at a time of about 250 nsec, an initial voltage VC of about 0.6V is generated. Accordingly, an enable section of the pulse PS may be designed for a time interval of about 220 nsec to about 300 nsec.

The initial voltage VC of the voltage divider 100 is fixed at the designed point of time. Thus, by including the voltage divider 100 in the PLL circuit 200, a specific level of the initial voltage VC is generated and thus the lock-in time can be reduced. In the example shown in FIG. 4, the initial voltage VC is maintained at a level of about 0.6V. Therefore, when the phase and frequency are fixed and control voltage VCTRL of the VCO 118 is at a level of about 0.6V, the lock-in time is reduced.

However, a locked control voltage (VCTRL) level of the VCO 118 changes according to an operating frequency of a device, in which the PLL circuit 200 is employed. For example, when the same PLL circuit is employed in two semiconductor memory devices with different operating frequencies, the lock-in times are different and respective levels of the control voltages VCTRL of the VCO at the lock time points are also different. In general, when an operating frequency is relatively high, the level of the control voltage VCTRL is higher than a control voltage (VCTRL) level of a relatively low operating frequency.

Therefore, when the initial voltage VC is provided through the voltage divider 100, described above, the initial voltage VC is locked, and so lock-in times of the PLL circuit 200 applied to devices having mutually different operating frequencies are different. For example, when the level of the initial voltage VC is designed low, the lock-in time of the PLL circuit 200 is lengthened for a high operating frequency, and when the level of the initial voltage VC is designed high, the lock-in time of the PLL circuit 200 is lengthened for a low operating frequency.

A semiconductor memory device has a relatively high operating speed, so its corresponding operating frequency is high. It therefore may employ a voltage divider in which a level of initial voltage VC is controlled according to the operating frequency, or a PLL circuit 200 capable of substantially reducing the lock-in time in response to the operating frequency.

Figure 5:
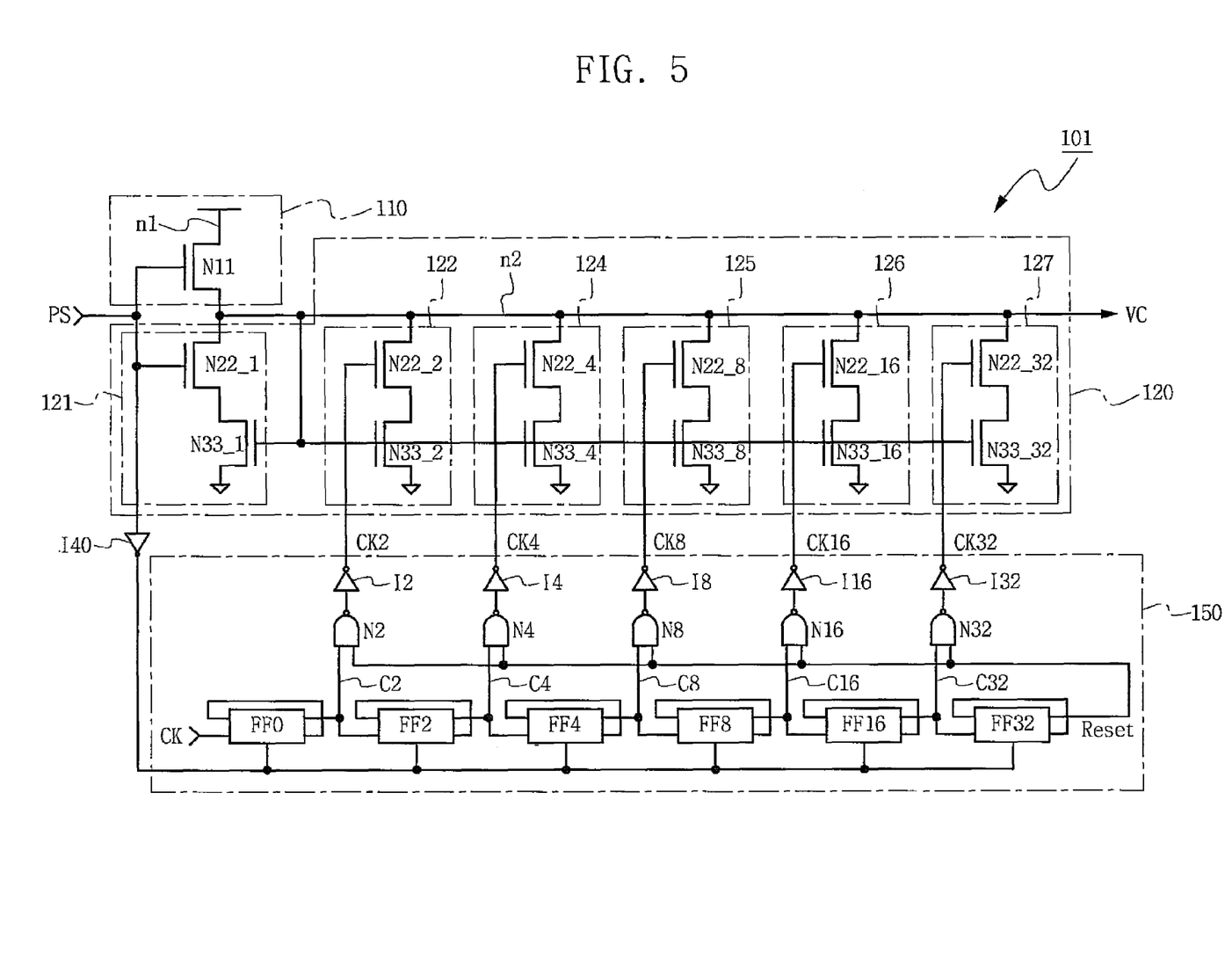
FIG. 5 is a circuit diagram of a voltage divider shown in FIG. 2, according to another illustrative embodiment of the invention.

FIG. 5 is a circuit diagram of a voltage divider VD 101 shown, according to another illustrative embodiment of the invention. In the voltage divider 101 of FIG. 5, a level of initial voltage is varied by operating frequency.

With reference to FIG. 5, the voltage divider 101 includes fixed resistor 110, variable resistor 120 and counting unit 150.

The fixed resistor 110 includes at least one resistance device N11, and has a uniform fixed resistance value regardless of an operating frequency. For example, when the resistance device N11 of the fixed resistor 110 is a transistor, the resistance device N11 has a resistance value corresponding to its size. The resistance device N11 may be an NMOS transistor, for example. The resistance device N11 may have a predetermined resistance value, and the resistance device N11 may include any type of resistance device(s) without departing from the spirit and scope of the present invention.

When the resistance device N11 includes an NMOS transistor, for example, the resistance device N11 is located between a power voltage terminal and an output node n2, and receives the pulse signal PS through a gate. The resistance device N11 may operate in a saturation area. At this time, an input voltage of the voltage divider 101 may be the power voltage VDD, and an input node n1 may be a terminal (node) to which the power voltage is input.

The variable resistor 120 has a variable resistance value that varies corresponding to variations of the operating frequency. More particularly, the variable resistor 120 may include, for example, multiple resistance devices N33_1, N33_2, N33_4, N33_8, N33_16 and N33_32 which have mutually different resistance values and are coupled in parallel with one another. The resistance devices N33_1, N33_2, N33_4, N33_8, N33_16 and N33_32 are each coupled to corresponding switching devices N22_1, N22_2, N22_4, N22_8, N22_16 and N22_32, respectively. That is, the variable resistor 120 includes multiple unit resistors 121, 122, 124, 125, 126 and 127 structured to have one switching device and one resistance device coupled in series with each other between the output node n2 and a ground terminal.

In another illustrative embodiment, the resistance devices N33_1, N33_2, N33_4, N33_8, N33_16 and N33_32 may have the same resistance values, although this embodiment is not further described herein.

When the resistance devices N33_1, N33_2, N33_4, N33_8, N33_16 and N33_32 have mutually different resistance values, the resistance devices N33_1, N33_2, N33_4, N33_8, N33_16 and N33_32 may have resistance values following a sequentially regular rule. For example, the resistance device N33_1 may have a resistance value twice the resistance device N33_2, the resistance device N33_2 may have a resistance value twice the resistance device N33_4, the resistance device N33_4 may have a resistance value twice the resistance device N33_8, the resistance device N33_8 may have a resistance value twice the resistance device N33_16, and the resistance device N33_16 may have a resistance value twice the resistance device N33_32. In this example, the resistance device N33_1 has a resistance value corresponding to 32 times of the resistance device N33_32.

The resistance devices N33_1, N33_2, N33_4, N33_8, N33_16 and N33_32 may each have a given resistance value. This may be applied to all resistance devices known to those skilled in the art. For example, when each of the resistance devices N33_1, N33_2, N33_4, N33_8, N33_16 and N33_32 and the corresponding switching devices N22_1, N22_2, N22_4, N22_8, N22_16 and N22_32 includes an NMOS transistor, the resistance devices N33_1, N33_2, N33_4, N33_8, N33_16 and N33_32 may operate in a saturation area, and the switching devices N22_1, N22_2, N22_4, N22_8, N22_16 and N22_32 may operate in a linear area.

Although FIG. 5 depicts six unit resistors 121, 122, 124, 125, 126 and 127, it is understood that fewer or more unit resistors may be included as needed, according to design criteria. For purposes of discussion, the six unit resistors 121, 122, 124, 125, 126 and 127 depicted in the illustrative embodiment of FIG. 5 are referenced in the following description.

Of the unit resistors 121, 122, 124, 125, 126 and 127, first unit resistor 121 includes the first switching device N22_1 and the first resistance device N33_1 coupled in series between the output node n2 and a ground terminal. The first switching device N22_1 is coupled between the output node n2 and the first resistance device N33_1, and a gate of the first switching device N22_1 receives the pulse PS. The first resistance device N33_1 is coupled between the first switching device N22_1 and the ground terminal, and a gate of the first resistance device N33_1 is coupled to the output node n2.

The second unit resistor 122 includes the second switching device N22_2 and the second resistance device N33_2 coupled in series between the output node n2 and the ground terminal. The second switching device N22_2 is coupled between the output node n2 and the second resistance device N33_2, and a gate of the second switching device N22_2 receives a first bit signal CK2 from the counting unit 150. The second resistance device N33_2 is coupled between the second switching device N22_2 and the ground terminal, and a gate of the second resistance device N33_2 is coupled to the output node n2.

The third unit resistor 124 includes a third switching device N22_4 and a third resistance device N33_4 coupled in series between the output node n2 and the ground terminal. The third switching device N22_4 is coupled between the output node n2 and the third resistance device N33_4, and a gate of the third switching device N22_4 receives a second bit signal CK4 from the counting unit 150. The third resistance device N33_4 is coupled between the third switching device N22_4 and the ground terminal, and a gate of the third resistance device N33_4 is coupled to the output node n2.

The fourth unit resistor 125 includes a fourth switching device N22_8 and a fourth resistance device N33_8 coupled in series between the output node n2 and the ground terminal. The fourth switching device N22_8 is coupled between the output node n2 and the fourth resistance device N33_8, and a gate of the fourth switching device N22_8 receives a third bit signal CK8 from the counting unit 150. The fourth resistance device N33_8 is coupled between the fourth switching device N22_8 and the ground terminal, and a gate of the fourth resistance device N33_8 is coupled to the output node n2.

The fifth unit resistor 126 includes a fifth switching device N22_16 and a fifth resistance device N33_16 coupled in series between the output node n2 and the ground terminal. The fifth switching device N22_16 is coupled between the output node n2 and the fifth resistance device N33_16, and a gate of the fifth switching device N22_16 receives a fourth bit signal CK16 from the counting unit 150. The fifth resistance device N33_16 is coupled between the fifth switching device N22_16 and the ground terminal, and a gate of the fifth resistance device N33_16 is coupled to the output node n2.

The sixth unit resistor 127 includes a sixth switching device N22_32 and a sixth resistance device N33_32 coupled in series between the output node n2 and the ground terminal. The sixth switching device N22_32 is coupled between the output node n2 and the sixth resistance device N33_32, and a gate of the sixth switching device N22_32 receives a fifth bit signal CK32 from the counting unit 150. The sixth resistance device N33_32 is coupled between the sixth switching device N22_32 and the ground terminal, and a gate of the sixth resistance device N33_32 is coupled to the output node n2.

The counting unit 150 selects at least one of the resistance devices N33_1, N33_2, N33_4, N33_8, N33_16 and N33_32, and decides the variable resistance value using multiple bit signals counted and output corresponding to an operating frequency as a switching signal. The counting unit 150 may include a down counter.

In another illustrative embodiment of the voltage divider 101, the variable resistor 120 may be located between the input node n1 and the output node n2, and the fixed resistor 110 may be located between the output node and a ground node. In this configuration, the counting unit 150 may include an up counter.

The counting unit 150 may have a structure that includes multiple flip-flops FF0, FF2, FF4, FF8, FF16 and FF32, which are cascade coupled with one another. The flip-flops FF0, FF2, FF4, FF8, FF16 and FF32 may be individual D flip-flops, for example. The flip-flops FF0, FF2, FF4, FF8, FF16 and FF32 each use the pulse PS or an inverted signal of the pulse PS as an enable signal, so as to operate only in the enable portion of the pulse PS.

The flip-flops FF0, FF2, FF4, FF8, FF16 and FF32 may correspond to the number of unit resistors 121, 122, 124, 125, 126 and 127, discussed above. When the variable resistor 120 includes six unit resistors, for example, the unit resistors 121, 122, 124, 125, 126 and 127, the control unit 150 may likewise include six flip-flops, first to six flip-flops FF0, FF2, FF4, FF8, FF16 and FF32, which constitute a hex-counter.

A first flip-flop FF0 of the flip-flops FF0, FF2, FF4, FF8, FF16 and FF32 is configured to receive an inverted signal of the pulse PS as an enable signal and a clock CK of the operating frequency of the semiconductor memory device, which includes the voltage divider or PLL circuit, as a clock input. The first flip-flop FF0 also receives its own (FF0) inverted output as a data input. As shown, an inverter I40 is configured to provide an inverted signal of the pulse PS.

A second flip-flop FF2 is configured to receive an inverted signal of the pulse PS as an enable signal, an output C2 of the first flip-flop FF0 as a clock input, and its own (FF2) inverted output as a data input.

A third flip-flop FF4 is configured to receive an inverted signal of the pulse PS as an enable signal, an output C4 of the second flip-flop FF2 as a clock input, and its own (FF4) inverted output as a data input.

A fourth flip-flop FF8 is configured to receive an inverted signal of the pulse PS as an enable signal, an output C8 of the third flip-flop FF4 as a clock input, and its own (FF8) inverted output as a data input.

A fifth flip-flop FF16 is configured to receive an inverted signal of the pulse PS as an enable signal, an output C16 of the fourth flip-flop FF8 as a clock input, and its own (FF 16) inverted output as a data input.

A sixth flip-flop FF32 is configured to receive an inverted signal of the pulse PS as an enable signal, an output C32 of the fifth flip-flop FF16 as a clock input, and its own (FF32) inverted output as a data input. The output of sixth flip-flop FF32 is used as a reset signal. That is, the sixth flip-flop FF32 may be configured for generation of the reset signal, rather than for operation as a counter.

The reset signal controls outputs C2, C4, C8, C16 and C32 of the counting unit 150 sent to the variable resistor 120. For example, when the reset signal has a high level, the outputs C2, C4, C8, C16 and C32 of the counting unit 150 are sent to the variable resistor 120, and thus function as switching signals. When the reset signal has a low level, the outputs C2, C4, C8, C16 and C32 of the counting unit 150 are not transferred to the variable resistor 120. This is in order to prevent the counting unit 150 from again returning to the initial value and beginning counting again after the counting of an initial value to a final value.

Thus, for example, when the counting unit 150 operates for a time shorter than the time it takes to count from the initial value to the final value, i.e., when the enable section of the pulse PS has a time interval shorter than the time it takes to count from the initial value to the final value, the sixth flip-flop FF32 may not be needed.

For the reset signal to be effective, the counting unit 150 includes a first NAND circuit N2 for logically operating on the output C2 of the first flip-flop FF0 and the reset signal, and a first inverter I2. Further, the counting unit 150 includes a second NAND circuit N4 for logically operating on the output C4 of the second flip-flop FF2 and the reset signal, and a second inverter I4; a third NAND circuit N8 for logically operating on the output C8 of the third flip-flop FF4 and the reset signal, and a third inverter I8; a fourth NAND circuit N16 for logically operating on the output C16 of the fourth flip-flop FF8 and the reset signal, and a fourth inverter I16;

and a fifth NAND circuit N32 for logically operating on the output C32 of the fifth flip-flop FF16 and the reset signal, and a fifth inverter I32.

As described above, for example, when the enable section of the pulse PS is a time interval shorter than the time it takes for the counting unit 150 to count from the initial value to the final value, the sixth flip-flop FF32 need not be included. In this case, the NAND circuits N2, N4, N8, N16 and N32 and the corresponding inverters I2, I4, I8, I16 and I32 likewise need not be included. Accordingly, the outputs C2, C4, C8, C16 and C32 of the flip-flops FF0, FF2, FF4, FF8, FF16 and FF32 become the final output signals CK2, CK4, CK8, CK16 and CK32, respectively.

When the reset signal Reset is used, an output of the first inverter I2 becomes first bit signal CK2, an output of the second inverter I4 becomes second bit signal CK4, an output of the third inverter I8 becomes third bit signal CK8, an output of the fourth inverter I16 becomes fourth bit signal CK16, and an output of the fifth inverter I32 becomes a fifth bit signal CK32. The respective outputs C2, C4, C8, C16 and C32 of the flip-flops FF0, FF2, FF4, FF8, FF16 and FF32 may be bit signals of the counting unit 150, in principle, but the respective outputs C2, C4, C8, C16 and C32 of the flip-flops FF0, FF2, FF4, FF8, FF16 and FF32 and final output signals CK2, CK4, CK8, CK16 and CK32 of the counting unit 150 have the same level state in the enable section of the pulse PS when the reset signal Reset is in the high level state.

Further, for example, when the reset signal Reset is not needed or not used, the respective outputs C2, C4, C8, C16 and C32 of the flip-flops FF0, FF2, FF4, FF8, FF16 and FF32 become the final output signals CK2, CK4, CK8, CK16 and CK32 of the counting unit 150, respectively. Thus, the final output signals CK2, CK4, CK8, CK16 and CK32 of the counting unit 150 may be called the bit signals of the counting unit 150.

Figure 6:
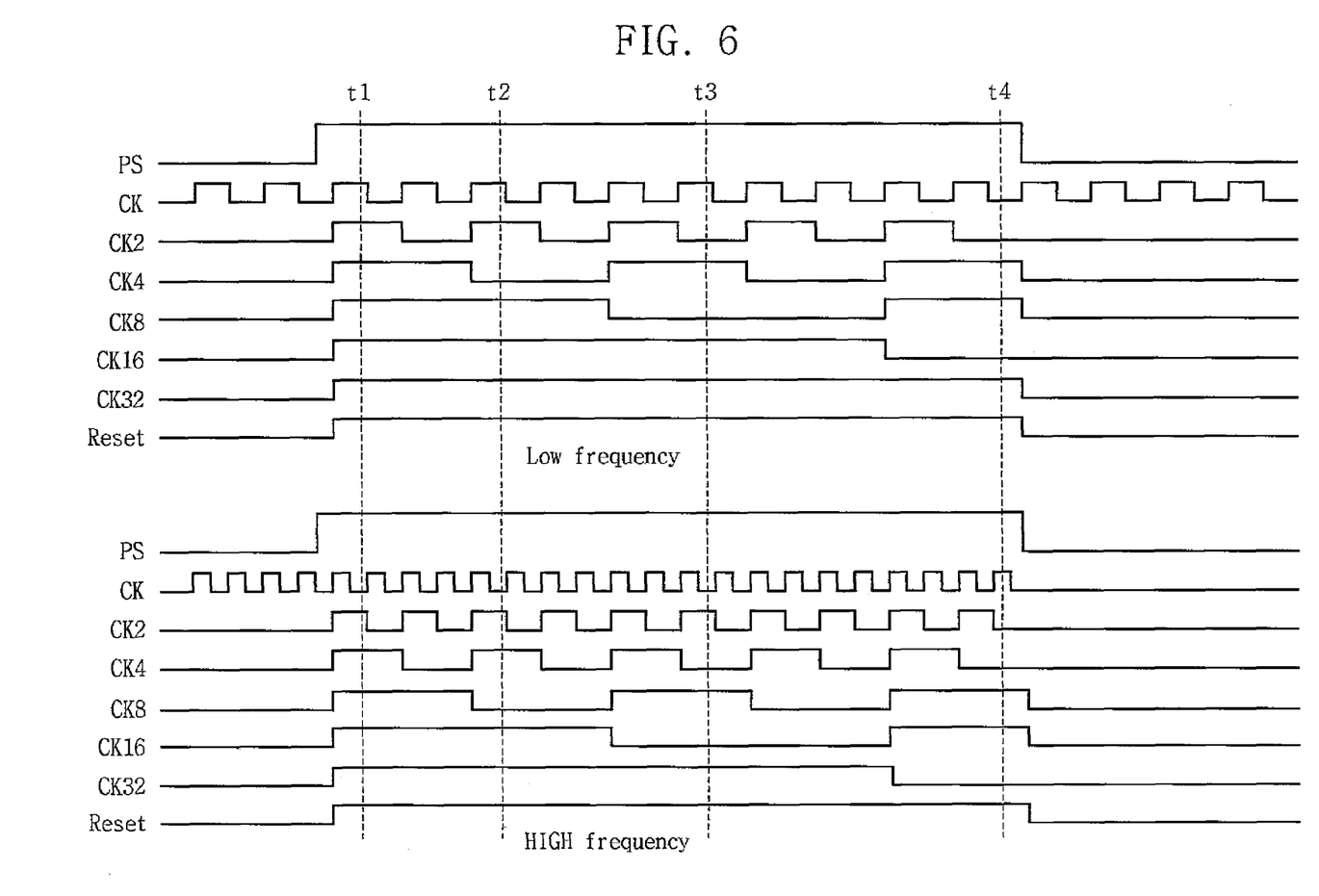
FIG. 6 is a timing diagram illustrating operation timings of FIG. 5, according to an illustrative embodiment of the invention.

FIG. 6 is a timing diagram illustrating operation timings of FIG. 5, according to an illustrative embodiment of the invention. In FIG. 6, the upper set of timings reflects a relatively low operating frequency, and the lower set of timings reflects a relatively high operating frequency. That is, FIG. 6 illustrates operation timings based on low or high frequencies of the input clock CK, e.g., input to the first flip-flop FF0. Operation of the voltage divider 101 is described below with reference to FIGS. 5 and 6.

As shown in FIGS. 5 and 6, a pulse PS is generated, having a given enable section at a high level. As described above, the pulse PS may be generated by the pulse generator PG 105. The counting unit 150 operates in response to the pulse PS, thus an operation section (time) of the counting unit 150 is uniform regardless of the operating frequency, and effectively functions independently of the operation frequency.

Like the timings shown in the upper set of FIG. 6, counter operation is slow at a relatively low frequency state. For example, with reference to first through fourth time points t1, t2, t3 and t4, the value indicated by the bit signals CK2, CK4, CK8, CK16 and CK32 at the first time point t1 is 11111, the value indicated by the bit signals CK2, CK4, CK8, CK16 and CK32 at the second time point t2 is 10111, the value indicated by the bit signals CK2, CK4, CK8, CK16 and CK32 at the third time point t3 is 01011 and the value indicated by the bit signals CK2, CK4, CK8, CK16 and CK32 at the fourth time point t4 is 01101.

On the other hand, like the timings shown in the lower set of FIG. 6, counter operation is fast at a relatively high frequency state. For example, with reference to the first to fourth time points t1, t2, t3 and t4, the value indicated by the bit signals CK2, CK4, CK8, CK16 and CK32 at the first time point t1 is 11111, the value indicated by the bit signals CK2, CK4, CK8, CK16 and CK32 at the second time point t2 is 11011, the value indicated by the bit signals CK2, CK4, CK8, CK16 and CK32 at the third time point t3 is 10101, and the value indicated by the bit signals CK2, CK4, CK8, CK16 and CK32 at the fourth time point t4 is 00110.

The bit signals CK2, CK4, CK8, CK16 and CK32 control the on/off states of the NMOS transistors in switching devices N22_2, N22_4, N22_8, N22_16, N22_32, respectively. For purposes of discussion, it is assumed that the bit signals CK2, CK4, CK8, CK16 and CK32 having a value of "1" are at a high level and having a value of "0" are at a low level. Accordingly, as shown in this example, the resistance value of the variable resistor 120 in a low operating frequency status may be compared with the resistance value of the variable resistor 120 in a high operating frequency status.

For example, at the fourth time point t4 at the low operating frequency, the bit signals CK2, CK4, CK8, CK16 and CK32 indicate a value of 01101, and thus NMOS transistors N22_4, N22_8, N22_32 are turned on and NMOS transistors N22_2 and N22_16 are turned off. Accordingly, in the low operating frequency status, each of the three NMOS transistors N33_4, N33_8 and N33_32 functions as a resistance device to determine a resistance value of the variable resistor 120, along with NMOS transistor N33_1, which provides a basic value.

Likewise, at the fourth time point t4 at the high operating frequency, the bit signals CK2, CK4, CK8, CK16 and CK32 indicate a value of 00110, and thus NMOS transistors N22_8 and N22_16 are turned on, and NMOS transistors N22_2, N22_4 and N22_32 are turned off. Accordingly, in the high frequency status, each of the two NMOS transistors N33_8 and N33_16 functions as a resistance device to determine a resistance value of the variable resistor 120, along with NMOS transistor N33_1, which provides a basic value.

The resistance devices are connected in parallel. Therefore, at the low operating frequency, the resistance value of the variable resistor 120 effectively depends upon the resistance value of NMOS transistor N33_32, which has the smallest resistance value among the four NMOS transistors N33_1, N33_4, N33_8 and N33_32 that are turned on. That is, the resistance value of variable resistance unit 120 in the low frequency status has a resistance value approximately equal to the resistance value of NMOS transistor N33_32.

Likewise, at the high operating frequency, the resistance value of the variable resistor 120 effectively depends upon the resistance value of the NMOS transistor N33_16, which has the smallest resistance value among three NMOS transistors N33_1, N33_8 and N33_16 that are turned on. That is, the resistance value of variable resistance unit 120 in the high operating frequency status has a resistance value approximately equal to the resistance value of NMOS transistor N33_16.

In this example, the resistance value of NMOS transistor N33_16 is greater than the resistance value of NMOS transistor N33_32. As a result, the resistance value of the variable resistor 120 at the low operating frequency is less than the resistance value of the variable resistor 120 at the high operating frequency. Therefore, in the initial voltage VC output from the voltage divider 101, a level of the initial voltage VC at the low operating frequency becomes smaller than a level of the initial voltage VC at the high operating frequency.

The PLL circuit 200 generally functions such that, when the operating frequency becomes higher, the level of control voltage VCTRL (input voltage of VCO 118) at a lock-in time point is higher. Thus, in a voltage divider 100/101 in which a level of the initial voltage VC becomes higher when an operating frequency becomes higher, the lock-in time of the PLL circuit 200 can be stably reduced.

Figure 7:
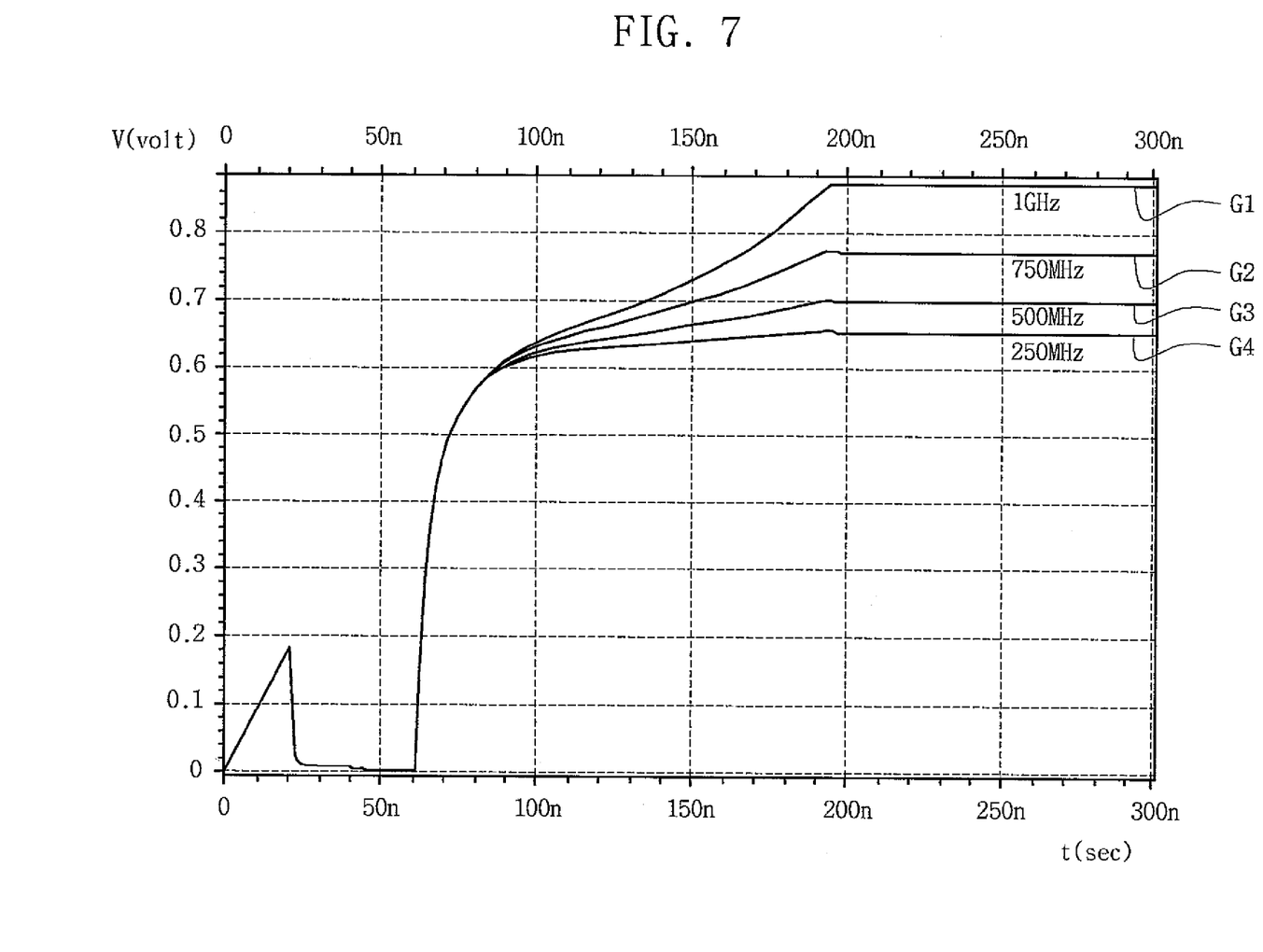
FIG. 7 is a graph showing initial voltage changes for frequencies of a voltage divider shown in FIG. 2, according to an illustrative embodiment of the invention.

FIG. 7 is a graph showing initial voltage changes, as output by a voltage divider shown in FIG. 2, for various frequencies of the voltage divider, according to an illustrative embodiment of the invention.

As shown in FIG. 7, it is assumed for purposes of discussion that when about 200 nsec lapses, an initial voltage VC of about 0.6V~0.9V is generated. In this case, the enable section of the pulse PS may be designed to have a time interval of about 200 nsec to about 300 nsec.

Graph G1 indicates that the initial voltage VC has a level of about 0.88V for an operating frequency of 1 GHz. Graph G2 indicates that the initial voltage VC has a level of about 0.77V for an operating frequency of 750 MHz. Graph G3 indicates that the initial voltage VC has a level of about 0.70V for an operating frequency of 500 MHz. Graph G4 indicates that the initial voltage VC has a level of about 0.65V for an operating frequency of 250 MHz. Accordingly, graphs G1~G4 show that, when the operating frequency becomes lower, the level of initial voltage VC also becomes lower.

As described above, according to various embodiments of the invention, the initial voltage may be varied in correspondence with the operating frequency. Accordingly, even operating frequencies are different, the lock-in time of a PLL circuit may be reduced. In addition, a voltage divider may be adapted to control the initial voltage corresponding to the operating frequency.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

The drawings and specification have disclosed illustrative embodiments of the invention and, although specific terms may be employed, they are used in a general and descriptive sense, and not for purposes of limitation.

What is claimed is:

1. A voltage divider for dividing an input voltage, the voltage divider comprising:
a fixed resistor having a fixed resistance value independent of an operating frequency, the fixed resistor comprising at least one resistance device;
a variable resistor having a variable resistance value that varies corresponding to a variation of the operating frequency, the variable resistor comprising a plurality of parallel resistance devices that have a corresponding plurality of different resistance values;
an input node for receiving the input voltage;
an output node for outputting an output voltage comprising the input voltage divided based on the fixed resistance value and the variable resistance value; and
a counter for selecting at least one of the plurality of resistance devices of the variable resistor by using bit signals corresponding to the operating frequency as switching signals, so as to determine the variable resistance value.

2. The voltage divider of claim 1, wherein the counter comprises one of an up counter or a down counter.

3. The voltage divider of claim 2, wherein the counter comprises a plurality of flip-flops in a cascade connection structure.

4. The voltage divider of claim 3, wherein the plurality of flip-flops comprises first and second flip-flops, the first flip-flop comprising a first data input that receives an inverted output of the first flip-flop synchronously with a clock signal corresponding to the operating frequency, and the second flip-flop comprising a clock input and a second data input, the clock input receiving an output of the first flip-flop and the second data input receiving an inverted output of the second flip-flop.

5. The voltage divider of claim 4, wherein each of the plurality of flip-flops comprises a D flip-flop.

6. The voltage divider of claim 1, wherein the plurality of resistance devices of the variable resistor are individually coupled to the output node through a corresponding plurality of switches.

7. The voltage divider of claim 6, wherein each of the at least one resistance device of the fixed resistor and the plurality of resistance devices of the variable resistor comprises an NMOS transistor operating in a saturation region, and wherein each of the plurality of switches comprises an NMOS transistor operating in a triode or linear region.

8. A phase lock loop (PLL) circuit, comprising:
a phase and frequency detector configured to compare phase and frequency of a reference signal and an oscillation signal, and to generate a comparison signal corresponding to a phase difference and a frequency difference;
a charge pump configured to control an output charge amount in response to the comparison signal from the phase and frequency detector;
a loop filter configured to filter an output of the charge pump and to generate a control voltage;
a voltage control oscillator configured to initially generate the oscillation signal through an initial voltage, and subsequently to generate the oscillation signal corresponding to the control voltage; and
an initial voltage generator operating in response to a reset signal of the PLL circuit, the initial voltage generator generating the initial voltage having a level that varies corresponding to an operating frequency, and providing the initial voltage to the voltage control oscillator, wherein the initial voltage generator comprises:
a pulse generator configured to generate a pulse in response to the reset signal of the PLL circuit, the pulse comprising an enable section; and
a voltage divider configured to operate at the enable section of the pulse and to generate the initial voltage having the level that varies corresponding to the operating frequency, wherein the voltage divider comprises:
a fixed resistor having a predetermined fixed resistance value regardless of the operating frequency, the fixed resistor comprising at least one resistance device;
a variable resistor having a variable resistance value varying corresponding to a variation of the operating frequency, the variable resistor comprising a plurality of resistance devices connected in parallel and having a corresponding plurality of different resistance values;
an input node configured to receive the input voltage;
an output node configured to output as an output voltage the input voltage divided based on the fixed resistance value and the variable resistance value; and
a counting unit configured to select at least one of the plurality of resistance devices of the variable resistor by using a plurality of bit signals corresponding to the operating frequency as a switching signal, so as to determine the variable resistance value.

9. The circuit of claim 8, wherein the counting unit comprises one of an up counter or a down counter.

10. The circuit of claim 9, wherein the counting unit comprises a plurality of flip-flops in a cascade coupling structure.

11. The circuit of claim 10, wherein the plurality of flip-flops comprise at least first and second flip-flops, the first flip-flop comprising a first data input for receiving an inverted output of the first flip-flop, synchronously to a clock signal corresponding to the operating frequency, and the second flip-flop comprising a clock input for receiving an output of the first flip-flop and a second data input for receive an inverted output of the second flip-flop.

12. The circuit of claim 11, wherein each of the plurality of flip-flops comprises a D flip-flop.

13. The circuit of claim 8, wherein the plurality of resistance devices of the variable resistor are individually coupled to the output node through a corresponding plurality of switches.

14. The circuit of claim 13, wherein each of the resistance device of the fixed resistor and the plurality of resistance devices of the variable resistor comprises an NMOS transistor operating in a saturation region, and wherein each of the switches comprises an NMOS transistor operating in a triode or linear region.

15. A voltage divider, comprising:
- a variable resistor having a resistance value that varies corresponding to a variation of an operating frequency, the variable resistor comprising a plurality of parallel resistance devices that have a corresponding plurality of different resistance values;
- a fixed resistor having a fixed resistance value regardless of the variation of the operating frequency, the voltage divider generating an output voltage varied corresponding to the operating frequency; and
- a counter for selecting at least one of the plurality of resistance devices of the variable resistor by using bit signals corresponding to the operating frequency as switching signals, so as to determine the variable resistance value.

* * * * *